United States Patent
Chen et al.

(10) Patent No.: US 11,342,840 B2
(45) Date of Patent: May 24, 2022

(54) SWITCHING DEVICE AND LEAKAGE CURRENT CONTROL METHOD

(71) Applicant: Realtek Semiconductor Corporation, Hsinchu (TW)

(72) Inventors: Leaf Chen, Hsinchu (TW); Ya-Hsuan Sung, Taipei (TW); Li-Chen Liu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 134 days.

(21) Appl. No.: 16/662,192

(22) Filed: Oct. 24, 2019

(65) Prior Publication Data

US 2020/0244165 A1 Jul. 30, 2020

(30) Foreign Application Priority Data

Jan. 24, 2019 (TW) ................. 108102771

(51) Int. Cl.
| | | |
|---|---|---|
| *H02M 3/156* | (2006.01) | |
| *H03K 17/30* | (2006.01) | |
| *G01R 31/28* | (2006.01) | |
| *G01R 31/50* | (2020.01) | |
| *G01R 31/68* | (2020.01) | |
| *H03K 17/693* | (2006.01) | |
| *H02M 1/08* | (2006.01) | |

(52) U.S. Cl.
CPC ........ *H02M 3/156* (2013.01); *G01R 31/2829* (2013.01); *G01R 31/50* (2020.01); *G01R 31/68* (2020.01); *H03K 17/302* (2013.01); *H03K 17/693* (2013.01); *H02M 1/08* (2013.01); *H03K 2217/0018* (2013.01); *H03K 2217/0054* (2013.01)

(58) Field of Classification Search
CPC .... G01R 31/68; G01R 31/28; G01R 31/2829; G01R 31/50; H02M 3/156; H02M 1/08; H02M 3/155–1588; H03K 17/302; H03K 17/693; H03K 2217/0018; H03K 2217/0054
See application file for complete search history.

(56) References Cited

U.S. PATENT DOCUMENTS

| 5,541,799 A | * | 7/1996 | Schmidt | ............. H03K 17/0822 361/91.5 |
| 5,874,838 A | * | 2/1999 | Rees | ................ H03K 19/00315 326/86 |
| 5,959,494 A | * | 9/1999 | Fotouhi | ................ H03K 17/302 327/427 |
| 6,040,708 A | * | 3/2000 | Blake | ............... H03K 3/356113 326/33 |

(Continued)

*Primary Examiner* — Yusef A Ahmed
(74) *Attorney, Agent, or Firm* — Locke Lord LLP; Tim Tingkang Xia, Esq.

(57) ABSTRACT

A switching device includes a first switch and a threshold voltage adjustment circuitry. The first switch is configured to be selectively turned on according to an enable signal, in order to connect a first pin to a second pin. The threshold voltage adjustment circuitry is configured to adjust a voltage level of a bulk terminal of the first switch according to the enable signal and a voltage provided from a power source. In response to the voltage being de-asserted, the threshold voltage adjustment circuitry is further configured to cut off a signal path between the bulk terminal and the power source.

7 Claims, 3 Drawing Sheets

(56) References Cited

U.S. PATENT DOCUMENTS

| | | | |
|---|---|---|---|
| 2006/0066355 A1* | 3/2006 | Gosmain | H03K 19/00315 326/87 |
| 2010/0148851 A1* | 6/2010 | Holzmann | H03K 17/302 327/437 |
| 2010/0225378 A1* | 9/2010 | Nakatsuka | H03K 17/693 327/434 |
| 2015/0365079 A1* | 12/2015 | Tsai | H03K 19/017509 327/306 |
| 2016/0035412 A1* | 2/2016 | Vyavahare | G11C 7/1057 365/189.08 |
| 2017/0047039 A1* | 2/2017 | Lu | H03K 17/145 |
| 2017/0264281 A1* | 9/2017 | Mathad | H03K 17/08104 |
| 2017/0331375 A1* | 11/2017 | Chen | G05F 1/575 |
| 2018/0013417 A1* | 1/2018 | Samuels | H03K 17/102 |
| 2018/0152137 A1* | 5/2018 | Nakamoto | H02J 7/35 |
| 2019/0348978 A1* | 11/2019 | Demirci | H03K 19/00315 |
| 2020/0076425 A1* | 3/2020 | Garg | H03K 17/0822 |
| 2020/0083850 A1* | 3/2020 | Chen | H03F 1/565 |
| 2020/0083878 A1* | 3/2020 | Namai | H03K 17/0822 |
| 2020/0119729 A1* | 4/2020 | Sung | H03K 17/6872 |
| 2020/0136381 A1* | 4/2020 | Wu | H03K 17/08104 |
| 2020/0303946 A1* | 9/2020 | Sung | H02J 9/005 |
| 2021/0021894 A1* | 1/2021 | Khan. P | H04N 17/04 |
| 2021/0091668 A1* | 3/2021 | Buhari | H03K 17/08122 |
| 2021/0119527 A1* | 4/2021 | Tan | H02H 7/1213 |
| 2021/0119629 A1* | 4/2021 | Narayanasamy | H03K 17/08122 |
| 2021/0194359 A1* | 6/2021 | Qu | H02M 3/155 |

\* cited by examiner

400

| Adjusting voltage level of bulk terminal of switch MP1 according to enable signal EN and voltage VDD from power source 201, in which whether switch MP1 is turned on is determined according to enable signal EN |—S410

↓

| When voltage VDD is de-asserted, signal path between bulk terminal and power source 201 is cut off |—S420

SWITCHING DEVICE AND LEAKAGE CURRENT CONTROL METHOD

RELATED APPLICATIONS

This application claims priority to Taiwan Application Serial Number 108102771, filed Jan. 24, 2019, which is herein incorporated by reference in its entirety.

BACKGROUND

Technical Field

The present disclosure relates to a switching device. More particularly, the present disclosure relates to a switching device and a leakage current control method that are applied to connectors.

Description of Related Art

One or more multiplexer circuits or switching circuits may be arranged in connectors, in order to support multiple connections. In some approaches, when a power source is de-asserted, internal circuits in the switching circuits may transmit leakage current(s) to a system power source due to floating voltage level(s), resulting in unnecessary damages.

SUMMARY

Some aspects of the present disclosure are to provide a switching device that includes a first switch and a threshold voltage adjustment circuitry. The first switch is configured to be selectively turned on according to an enable signal, in order to connect a first pin to a second pin. The threshold voltage adjustment circuitry is configured to adjust a voltage level of a bulk terminal of the first switch according to the enable signal and a voltage provided from a power source. In response to the voltage being de-asserted, the threshold voltage adjustment circuitry is further configured to cut off a signal path between the bulk terminal and the power source.

Some aspects of the present disclosure are to provide a leakage current control method, for controlling a first switch coupled between a first pin and a second pin, and the leakage current method that includes following operations: adjusting a voltage level of a bulk terminal of the first switch according to the enable signal and a voltage provided from a power source, wherein whether the first switch is turned on is determined according to the enable signal; and in response to the voltage being de-asserted, cutting off a signal path between the bulk terminal and the power source.

As described above, the switching device and the leakage current control method in embodiments of the present disclosure are able to assure that leakage current(s) cannot flow into a power source when a system voltage is de-asserted. As a result, the power source is prevented from being damaged by the leakage current(s).

BRIEF DESCRIPTION OF THE DRAWINGS

FIG. 4 is a flowchart of a leakage current control method according to some embodiments of the present disclosure.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuitry" may indicate a system formed with one or more circuits. The term "circuit" may indicate an object, which is formed with one or more transistors and/or one or more active/passive elements based on a specific arrangement, for processing signals.

Figure 1:
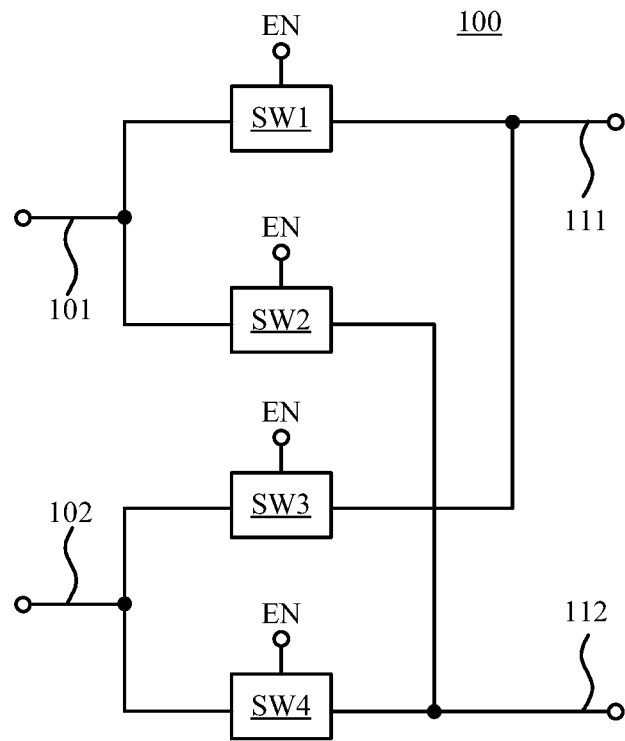
FIG. 1 is a schematic diagram of a switching device, according to some embodiments of the present disclosure.

Reference is made to FIG. 1. FIG. 1 is a schematic diagram of a switching device 100, according to some embodiments of the present disclosure. In some embodiments, the switch device 100 may be applied to various connectors, in order to connect with different pins. For example, in some embodiments, the switching device 100 may be applied to universal serial bus (USB) type-C connectors, in order to support plugs in right-side up and upside down.

The switching device 100 includes transmission gate circuits SW1-SW4. With the transmission gate circuits SW1-SW4, a pin 101 can be connected to one of pins 111 and 112, and a pin 102 can be connected another one of the pins 111 and 112.

For example, if the switching device 100 is applied to a USB type-C connector, based on industrial specification, a configuration channel (CC) pin of the USB type-C connector is for detecting whether a plug orientation of the connector is in right-side up or in upside down. If the plug orientation is determined to be in right-side up, the switching device 100 may operate in a first mode based on an enable signal EN having a first logic value (e.g., logic value of 1), in order to turn on the transmission gate circuits SW1 and SW4 and to turn off the transmission gate circuits SW2 and SW3. Under this condition, the pin 101 is connected to the pin 111, and the pin 102 is connected to the pin 112. Alternatively, if the plug orientation is determined to be in upside down, the switching device 100 may operate in a second mode based on the enable signal EN having a second logic value (e.g., logic value of 0), in order to turn on the transmission gate circuits SW2 and SW3 and to turn off the transmission gate circuits SW1 and SW4. Under this condition, the pin 101 is connected to the pin 112, and the pin 102 is connected to the pin 111.

In some embodiments, if the switching device 100 is applied to a USB type-C connector, the pins 101 and 102 may be sideband use (SBU) pins as defined in the industrial specification, and the pins 111 and 112 may be input/output ports of other circuits in the system. In some embodiments, the enable signal EN may be generated from a host terminal device or other controller circuits in the system. The above application of the switching device 100 and types of each pin are given for illustrative purposes, and the present disclosure is not limited thereto.

Figure 2:
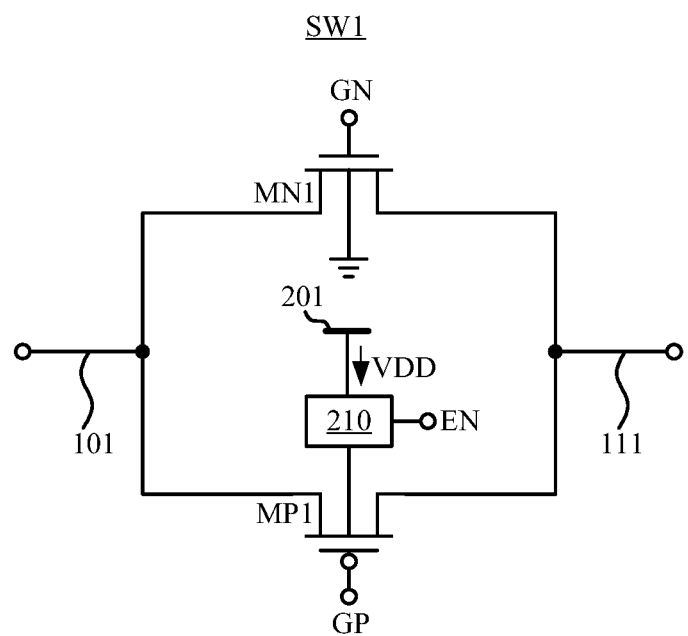
FIG. 2 is a circuit diagram of the transmission gate circuit in FIG. 1 according to some embodiments of the present disclosure.

Reference is made to FIG. 2. FIG. 2 is a circuit diagram of the transmission gate circuit SW1 in FIG. 1 according to some embodiments of the present disclosure. For ease of understanding, like elements in FIGS. 1-2 are designated with the same reference number. In some embodiments, the transmission gate circuits SW1-SW4 have the same circuit architecture.

Figure 3:
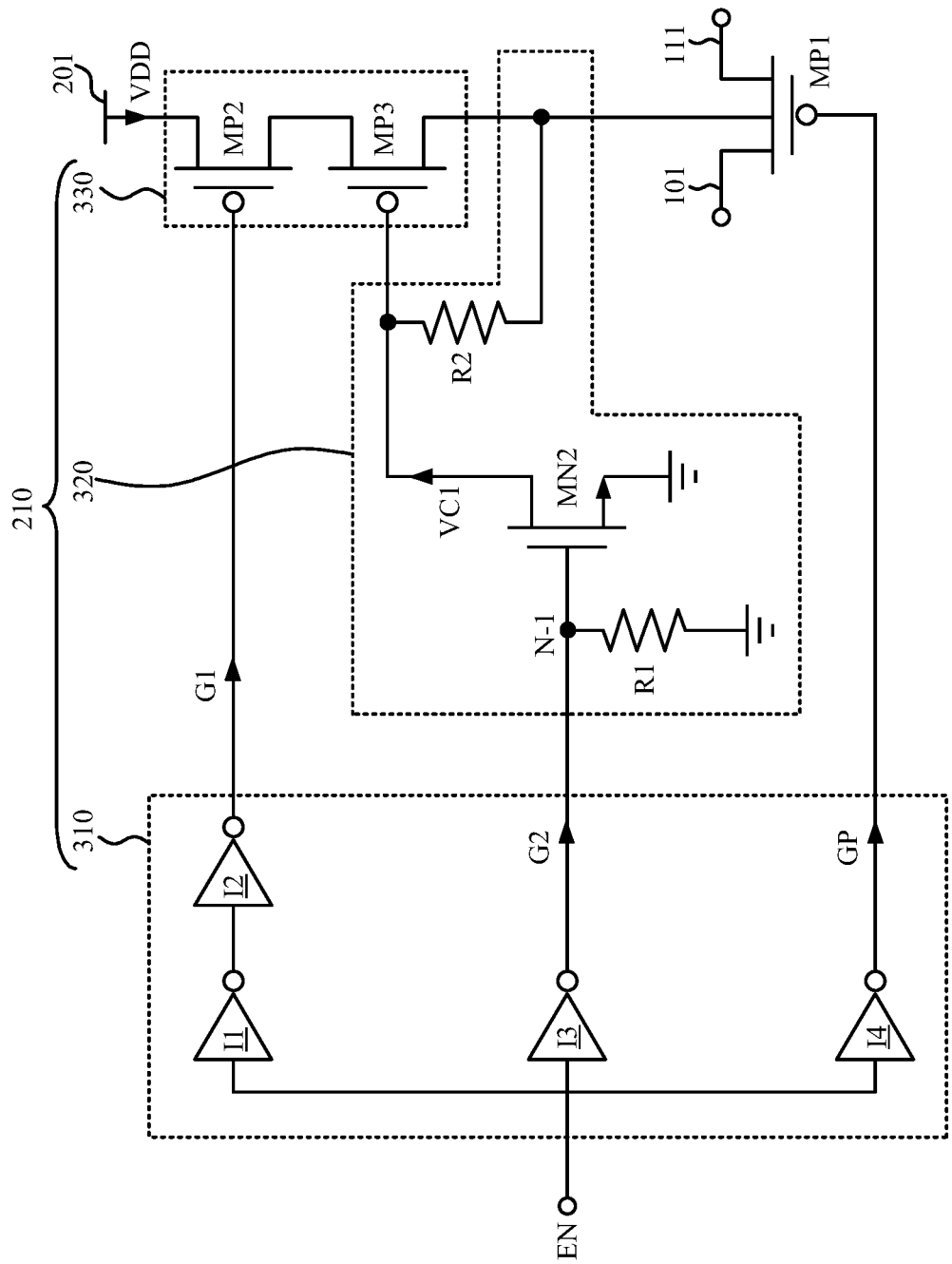
FIG. 3 is a circuit diagram of the threshold voltage adjustment circuitry and the switch in FIG. 2 according to some embodiments of the present disclosure.

As shown in FIG. 2, the transmission gate circuit SW1 includes a switch MN1, a switch MP1, and a threshold voltage adjustment circuitry 210. The switches MN1 and MP1 are coupled in parallel with each other and between the pins 101 and 111, and are configured to be simultaneously turned on or off according to control signals GN and GP. In some embodiments, the control signals GN and GP are generated from the enable signal EN in FIG. 1. For example, as shown in FIG. 3, the control signal GP is generated in response to the enable signal EN.

The threshold voltage adjustment circuitry 210 is coupled to the switch MP1, in order to control a threshold voltage of the switch MP1. For example, the switch MP1 may be implemented with a P-type transistor, and the threshold voltage adjustment circuitry 210 may be coupled to a bulk terminal of the switch MP1 to adjust a voltage level of the bulk terminal of the switch MP1 according to the enable signal EN and a voltage VDD provided from a power source 201, in order to control the threshold voltage of the switch MP1. Moreover, in some embodiments, if the voltage VDD is de-asserted, the threshold voltage adjustment circuitry 210 is further configured to cut off a signal path between the bulk terminal of the switch MP1 and the power source 201. As a result, a signal from the pin 101 or a leakage current is prevented from flowing to the power source 201, in order to prevent the power source 201 from being damaged. In some embodiments, the term "de-assert" may indicate that the power source 201 is not powered and thus the voltage VDD is not provided, or may indicate that the voltage VDD has a floating level. Correspondingly, in some embodiments, the term "assert" may indicate that the power source 201 is powered to provide the voltage VDD having a predetermined level.

In some approaches, in order to turn off a switch thoroughly, an equivalent turn-on resistance of the switch is increased with a body effect, in order to prevent a signal from being transmitted by the switch by mistake when the switch is turned off. In these approaches, a P-type transistor of a transmission gate circuit is connected to a power source, in order to directly receive a highest voltage (e.g., the voltage VDD) in the system. However, if this highest voltage is de-asserted, an internal PN junction of the P-type transistor is turned on in a case where the voltage level of the pin 101 is higher than that of the bulk terminal. As a result, the signal or a leakage current may be transmitted from the pin to the power source by mistake, resulting in unnecessary damages.

Compared with these approaches, in some embodiments of the present disclosure, if the voltage VDD is de-asserted, the threshold voltage adjustment circuitry 210 is able to continuously operate to cut off the signal path between the bulk terminal of the switch MP1 and the power source 201, in order to assure that the signal or the current of the pin 101 cannot flow into the power source 201. As a result, the power source 201 is prevented from being damaged.

Reference is made to FIG. 3. FIG. 3 is a circuit diagram of the threshold voltage adjustment circuitry 210 and the switch MP1 in FIG. 2 according to some embodiments of the present disclosure. For ease of understanding, like elements in FIGS. 2-3 are designated with the same reference numbers.

A shown in FIG. 3, the threshold voltage adjustment circuitry 210 includes a signal generator circuit 310, a pull-down circuit, and a pull-up circuit 330. The signal generator circuit 310 is configured to generate control signals GP, G1, and G2 according to the enabling signal EN. For example, the signal generator circuit 310 includes inverters I1-I4, in which the inverters I1-I2 are coupled in series, in order to generate the control signal G1 according to the enable signal EN. The inverter I3 generates the control signal G2 according to the enable signal EN. The inverter I4 generates the control signal GP according to the enable signal EN.

In some embodiments, the inverters I1-I4 operate as buffers to increase driving abilities of various control signals. The number of the inverters I1-I4 is given for illustrative purposes, and the present disclosure is not limited thereto. For example, in some embodiments, a single one inverter may be utilized to generate an output signal according to the enable signal EN, in which this output signal may be generated as the control signal GP or G2, and the enable signal EN may be directly outputted as the control signal G1.

The pull-down circuit 320 is coupled to the bulk terminal of the switch MP1, the inverter I3, and the pull-up circuit 330. In some embodiments, the pull-down circuit 320 is configured to generate the control signal VC1 according to the enable signal EN.

For example, the pull-down circuit 320 includes resistors R1-R2 and a switch MN2. The resistor R1 is coupled between a node N-1 and ground, in which the node N-1 is coupled to the inverter I3 to receive the control signal G2. In other words, a level of the node N-1 is varied in response to the control signal G2 (or the enable signal EN). A control terminal of the switch MN2 is coupled to the node N-1, a first terminal of the switch MN2 is coupled to the pull-up circuit 330 and is configured to output the control signal VC1, and a second terminal of the switch MN2 is coupled to ground. With this arrangement, the switch MN2 may be turned on according to the level of the node N-1, in order to generate the control signal VC1. A first terminal of the resistor R2 is coupled to the first terminal of the switch MN2, and a second terminal of the switch R2 is coupled to the bulk terminal of the switch MP1. In some embodiments, the resistors R1-R2 have high resistance values, which may be, for example, at least one megohm.

The pull-up circuit 330 is coupled to the bulk terminal of the switch MP1, the inverter I2, the pull-down circuit 320 and a power source 201. In some embodiments, the pull-up circuit 330 is configured to be selectively turned on according to the enable signal EN and the control signal VC1, in order to adjust the voltage level of the bulk terminal of the switch MP1.

For example, the pull-up circuit 330 includes a switch MP2 and a switch MP3. In some embodiments, bulk terminals (not shown) of the switches MP2 and MP3 are configured to be floating. A control terminal of the switch MP2 is coupled to the inverter I2 to receive the control signal G1, and a first terminal of the switch MP2 is coupled to the power source 201 to receive the voltage VDD, and a second terminal of the switch MP2 is coupled to a first terminal of the switch MP3. The switch MP2 is configured to be turned on according to the control signal G1 (or the enable signal EN). A second terminal MP3 is coupled to the second terminal of the resistor R2 and the bulk terminal of the switch MP1. A control terminal of the switch MP3 is coupled to the first terminal of the resistor R2 and the first terminal of the switch MN2, in order to receive the control signal VC1. The switch MP3 is configured to be turned on according to the control signal VC1.

The following paragraph is given to illustrate operations related to the threshold voltage adjustment circuitry 210. When the voltage VDD is asserted and the switching device 100 operates in the first mode, the enable signal EN has a logic value of 1 (e.g., having a voltage level of the voltage VDD). Accordingly, each of the control signals GP and G2 has the logic value of 0, and the control signal G1 has the logic value of 1. In response to the control signal GP, the switch MP1 is turned on to connect the pin 101 to the pin 111. In response to the control signal G1, the switch MP2 is turned off. In response to the control signal G2, the switch MN2 is turned off. In other words, when operating in the first mode, the pull-down circuit 320 and the pull-up circuit 330 are all turned off. Under this condition, the bulk terminal of the switch MP1 is equivalently coupled to high impedance (i.e., the turned-off pull-up circuit 330 and pull-down circuit 320). Accordingly, the switch MP1 is considered to be free from the impacts of the body effect, and thus has a lower threshold voltage. As a result, the switch MP1 is able to have a lower turn-on resistance to connect the pin 101 to the pin 111.

Alternatively, when the voltage VDD is asserted and the switching device 100 operates in the second mode, the enable signal EN has the logic value of 0. Accordingly, each of the control signals GP and G2 has the logic value of 1, and the control signal G1 has the logic value of 1. In response to the control signal GP, the switch MP1 is turned off to disconnect the pin 101 from the pin 111. In response to the control signal G1, the switch MP2 is turned on. In response to the control signal G2, the switch MN2 is turned on to generate the control signal VC1 having a low voltage level (i.e., the voltage level of the control terminal of the switch MP3 is pulled down to ground). In response to the control signal VC1, the switch MP3 is turned on. In other words, when operating in the second mode, the pull-down circuit 320 and the pull-up circuit 330 are all turned on. Under this condition, the pull-up circuit 330 transmits the voltage VDD to the bulk terminal of the switch MP1. Accordingly, based on the body effect, the switch MP1 has a maximum threshold voltage. As a result, the switch MP1 is able to provide a higher resistance to disconnect the pin 101 from the pin 111.

Moreover, when the voltage VDD is de-asserted, the voltage VDD and the enable signal EN are unknown. Under this condition, the voltage levels of first and second terminals of the resistor R2 are the same, in order turn off the switch MP3. The resistor R1 pulls down the voltage level of the control terminal of the switch MN2 to ground, in order to turn off the switch MN2. Accordingly, a signal path between the bulk terminal of the switch MP1 and the power source 201 and/or a signal path from the switch MP1 and switch MN2 to ground are all turned off. As a result, the signal and/or leakage current on the pin 101 are prevented from flowing to the power source 201 via the bulk terminal of the switch MP1.

In some embodiments, the switches MP1-MP3 may be implemented with P-type transistors, and the switches MN1-MN2 may be implemented with N-type transistors. In some embodiments, the resistors R1-R2 may be implemented with poly-silicon resistors, or physical passive resistors. The above types of the transistors and implementations of the transistors R1-R2 are given for illustrative purposes, and the present disclosure is not limited thereto.

Reference is made to FIG. 4. FIG. 4 is a flowchart of a leakage current control method 400 according to some embodiments of the present disclosure. In some embodiments, the leakage current control method 400 includes operation S410 and operation S420.

In operation 410, the voltage level of the bulk terminal of the switch MP1 is adjusted according to the enable signal EN and the voltage VDD from the power source 201, in which whether the switch MP1 is turned on is determined according to the enable signal EN.

In operation S420, when the voltage VDD is de-asserted, the signal path between the bulk terminal and the power source 201 is cut off.

The above operations S410 and S420 can be understood with reference to embodiments of FIGS. 1-3, and thus the repetitious descriptions are not given herein. The above description of the leakage current control method 400 includes exemplary operations, but the operations of the leakage current control method 400 are not necessarily performed in the order described above. The order of the operations of the leakage current control method 400 can be changed, or the operations can be executed simultaneously or partially simultaneously as appropriate, in accordance with the spirit and scope of various embodiments of the present disclosure.

As described above, the switching device and the leakage current control method in embodiments of the present disclosure are able to assure that leakage current(s) cannot flow into a power source when a system voltage is de-asserted. As a result, the power source is prevented from being damaged by the leakage current(s).

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A switching device, comprising:
   a first switch configured to be selectively turned on according to an enable signal, in order to connect a first pin to a second pin; and
   a threshold voltage adjustment circuitry configured to adjust a voltage level of a bulk terminal of the first switch according to the enable signal and a voltage provided from a power source,
   wherein in response to the voltage, which is provided from the power source, being de-asserted, the threshold voltage adjustment circuitry is further configured to cut off a signal path between the bulk terminal and the power source;
   wherein the threshold voltage adjustment circuitry comprises:
      a pull-down circuit coupled to the bulk terminal, the pull-down circuit configured to generate a control signal according to the enable signal; and
      a pull-up circuit coupled to the power source and the pull-down circuit, the pull-up circuit configured to be selectively turned on according to the enable signal and the control signal, in order to adjust the voltage level of the bulk terminal;
   wherein the pull-down circuit comprises:
      a first resistor coupled between a first node and ground, wherein a voltage level of the first node is varied in response to the enable signal;
      a second switch configured to be turned according to the voltage level of the first node, in order to generate the control signal; and
      a second resistor coupled between the second switch and the bulk terminal; and
   wherein the pull-up circuit comprises:
      a third switch coupled to the bulk terminal and the second switch, the third switch configured to be turned on according to the control signal, wherein the second resistor and the third switch are coupled in parallel with each other; and
      a fourth switch coupled between the power source and the third switch, the fourth switch configured to be turned on according to the enable signal.

2. The switching device of claim 1, wherein when the voltage is asserted and the first switch is not turned on, the pull-up circuit is turned on to transmit the voltage to the bulk terminal.

3. The switching device of claim 1, wherein when the voltage is asserted and the first switch is turned on, the pull-down circuit and the pull-up circuit are turned off.

4. The switching device of claim 1, wherein when the voltage is de-asserted, the third switch is turned off by the second resistor.

5. A leakage current control method, for controlling a first switch coupled between a first pin and a second pin, the leakage current control method comprising:
   adjusting a voltage level of a bulk terminal of the first switch according to an enable signal and a voltage provided from a power source, wherein whether the first switch is turned on is determined according to the enable signal, wherein adjusting the voltage level of the bulk terminal of the first switch comprises: selectively turning on a pull-up circuit according to the enable signal and a control signal, in order to adjust the voltage level of the bulk terminal, wherein the pull-up circuit is coupled to the power source and the bulk terminal;
   in response to the voltage, which is provided from the power source, being de-asserted, cutting off a signal path between the bulk terminal and the power source; and
   generating, by a pull-down circuit, the control signal according to the enable signal, wherein the pull-down circuit is coupled to the bulk terminal and the pull-up circuit;
   wherein generating the control signal comprises: turning on a second switch of the pull-down circuit according to a voltage level of a first node, wherein the first node is coupled to ground via a first resistor, and the voltage level of the first node is varied in response to the enable signal; and
   wherein adjusting the voltage level of the bulk terminal further comprises:
      turning on a third switch of the pull-up circuit, wherein the third switch is coupled in parallel with a second resistor of the pull-down circuit, and is coupled to the bulk terminal and the second switch; and
      turning on a fourth switch of the pull-up circuit according to the enable signal, wherein the fourth switch is coupled between the power source and the third switch.

6. The leakage current control method of claim 5, wherein cutting off the signal path between the bulk terminal and the power source comprises:
   turning off, by the first resistor, the second switch when the voltage is de-asserted, wherein the second switch is coupled between the power source and the bulk terminal.

7. The leakage current control method of claim 5, wherein cutting off the signal path between the bulk terminal and the power source comprises:
   when the voltage is de-asserted, turning off the third switch by the second resistor.

* * * * *